(12) United States Patent
Fukazu et al.

(10) Patent No.: US 7,688,582 B2
(45) Date of Patent: Mar. 30, 2010

(54) ELECTRICAL DEVICE COOLING STRUCTURE IN VEHICLE

(75) Inventors: Tomohiro Fukazu, Saitama (JP); Takeo Nishibori, Saitama (JP); Kentaro Shibuya, Saitama (JP); Masao Kawata, Saitama (JP); Hiroo Yamaguchi, Saitama (JP); Junya Fujisawa, Saitama (JP); Atsushi Nakano, Saitama (JP); Hiroshi Kosaka, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 194 days.

(21) Appl. No.: 11/851,631

(22) Filed: Sep. 7, 2007

(65) Prior Publication Data

US 2008/0062622 A1 Mar. 13, 2008

(30) Foreign Application Priority Data

Sep. 7, 2006 (JP) ............................. 2006-242488
Sep. 7, 2006 (JP) ............................. 2006-242489

(51) Int. Cl.
*H05K 7/20* (2006.01)
*A47C 7/72* (2006.01)
*B60N 2/02* (2006.01)
*H05K 5/00* (2006.01)
*B60K 11/00* (2006.01)

(52) U.S. Cl. .................. 361/690; 361/694; 361/695; 297/180.1; 297/180.13; 297/180.14; 296/65.16; 296/65.05; 454/184; 180/68.1; 180/65.21; 180/68.5; 180/65.1; 903/903

(58) Field of Classification Search ................ 361/690, 361/692, 694, 695; 454/184, 120; 180/68.1, 180/65.21, 68.5, 65.1; 903/903; 297/180.1, 297/180.13, 180.14

See application file for complete search history.

(56) References Cited

U.S. PATENT DOCUMENTS 6,188,574 B1 2/2001 Anazawa (Continued)

FOREIGN PATENT DOCUMENTS

EP 1 067 006 A2 6/2000

(Continued)

OTHER PUBLICATIONS

European Search Report dated Oct. 22, 2007, Application No. EP 07 11 5723.

*Primary Examiner*—Zachary M Pape
(74) *Attorney, Agent, or Firm*—Westerman, Hattori, Daniels & Adrian, LLP

(57) ABSTRACT

In a power supply unit disposed below a floor behind a seat, battery modules are disposed in a lower position, and a DC/DC converter and a motor driving inverter are disposed side by side in a vehicle width direction above the battery modules. Thus, cooling air flowing from the front side to the rear side of a vehicle body is divided into upper and lower portions to cool in parallel the DC/DC converter and the motor driving inverter on the upper side and the battery modules on the lower side. Thus, it is possible to simplify a passage of the cooling air to reduce the size of the entire power supply unit, and improve mountability of the power supply unit on the vehicle body. Also, it is possible to apply low temperature cooling air, before heat exchange, to the battery module, the DC/DC converter, and the motor driving inverter.

7 Claims, 9 Drawing Sheets

U.S. PATENT DOCUMENTS

| | | | |
|---|---|---|---|
| 6,443,253 B1 * | 9/2002 | Whitehead et al. | 180/68.1 |
| 6,662,891 B2 * | 12/2003 | Misu et al. | 180/68.1 |
| 6,902,020 B2 * | 6/2005 | Kronner et al. | 180/68.5 |
| 7,004,233 B2 * | 2/2006 | Hasegawa et al. | 165/47 |
| 7,051,825 B2 * | 5/2006 | Masui et al. | 180/68.5 |
| 2003/0019232 A1 | 1/2003 | Matsuo et al. | |
| 2003/0186115 A1 * | 10/2003 | Shibasawa et al. | 429/100 |
| 2005/0111167 A1 * | 5/2005 | Yamaguchi et al. | 361/676 |
| 2005/0285563 A1 | 12/2005 | Yoneda | |
| 2007/0040418 A1 * | 2/2007 | Ohkuma et al. | 297/15 |
| 2007/0102213 A1 * | 5/2007 | Seo et al. | 180/68.1 |

FOREIGN PATENT DOCUMENTS

| | | |
|---|---|---|
| EP | 2004306726 | 11/2004 |
| EP | 2005153827 | 6/2005 |
| EP | 1 745 977 A1 | 1/2007 |
| JP | 200345392 A | 2/2003 |
| JP | 2005153827 A | 6/2005 |
| WO | WO 2007/031689 A1 | 3/2007 |

* cited by examiner

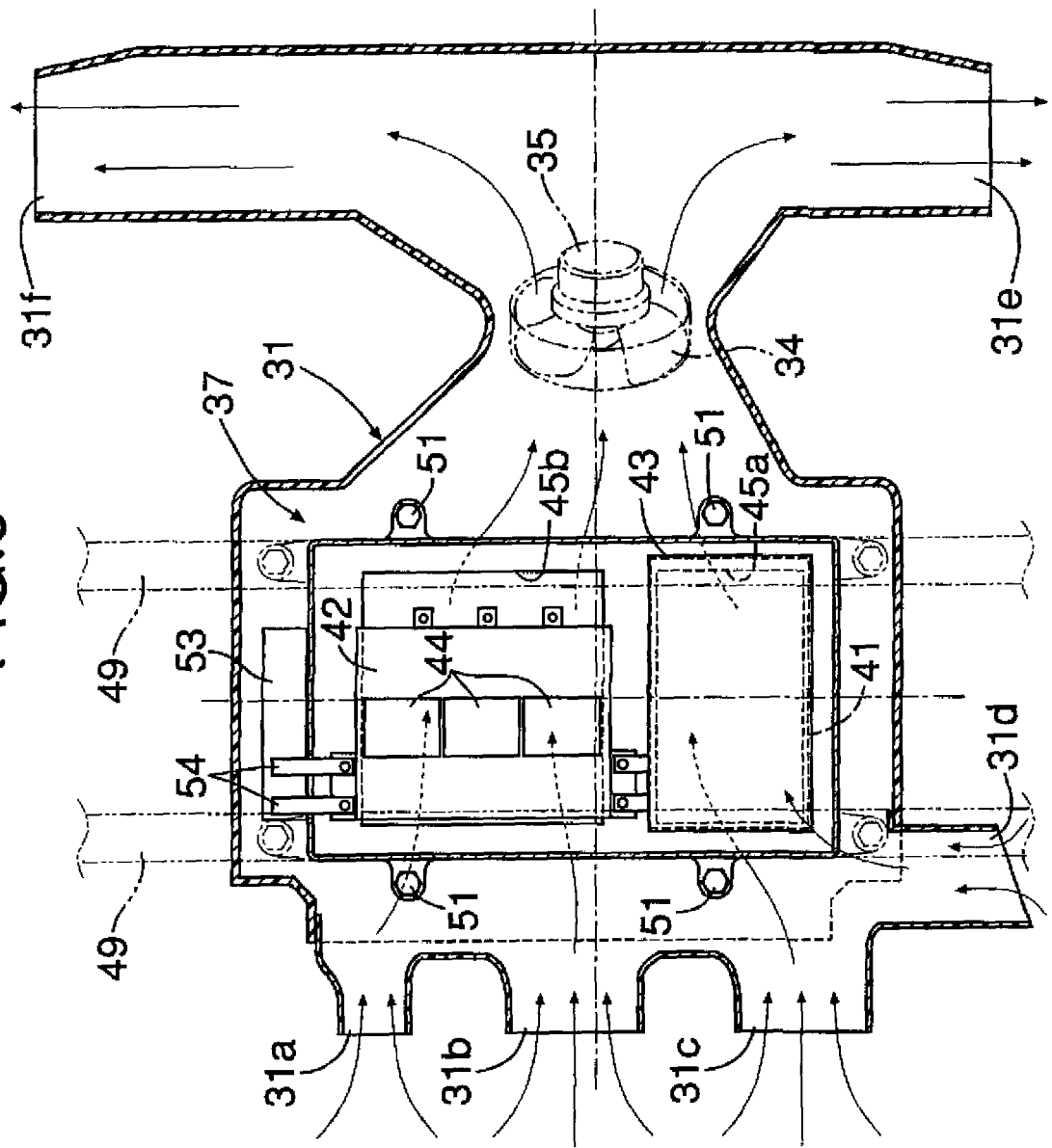

ELECTRICAL DEVICE COOLING STRUCTURE IN VEHICLE

BACKGROUND OF THE INVENTION

1. Field of the Invention

The present invention relates to an electrical device cooling structure in a vehicle, comprising: an electrical device which includes a battery for driving a motor for traveling, a DC/DC converter and a motor driving inverter, the electrical device being disposed below a floor behind a seat, and cooled by cooling air.

2. Description of the Related Art

Japanese Patent Application Laid-open No. 2003-45392 discloses a device in which a power supply device including a battery that drives a motor for traveling of an automobile is mounted in a trunk room behind a rear seat, and the battery is cooled by cooling air supplied by a forced air fan provided integrally with the power supply device.

Japanese Patent Application Laid-open No. 2005-153827 discloses a device in which a capacitor including a battery that drives a motor for traveling of an automobile, a DC/DC converter, a motor driving inverter, a cooling fan, and the like is disposed below a rear seat, and the battery, the DC/DC converter, and the motor driving inverter are cooled by cooling air sucked by a cooling fan.

Japanese Patent Application Laid-open No. 2003-45392 discloses that the battery of the power supply device is cooled by the cooling air supplied by the forced air fan, but does not disclose cooling of a DC/DC converter and a motor driving inverter included in the power supply device.

In Japanese Patent Application Laid-open No. 2005-153827, the battery, the DC/DC converter, the motor driving inverter, and the cooling fan are disposed in series in a vehicle width direction, and the battery, the DC/DC converter, and the motor driving inverter are sequentially cooled by the cooling air sucked by the cooling fan.

In this device, the temperature of the cooling air is gradually increased by heat exchange during the cooling of the battery, the DC/DC converter, and the motor driving inverter. Therefore, even if the battery on an upstream side can be sufficiently cooled, there is a possibility that the motor driving inverter on a downstream side is not sufficiently cooled. Also, because the battery, the DC/DC converter, the motor driving inverter and the cooling fan are disposed in series, the size of the power supply device is increased to impose a limitation in mounting the power supply device on the vehicle. Further, because resistance is increased in the passage of the cooling air, a large and high-performance cooling fan is disadvantageously needed.

SUMMARY OF THE INVENTION

The present invention has been achieved in view of the above-described circumstances, and has an object to enhance cooling performance for an electrical device which is disposed below a floor behind a seat in order to drive a motor for traveling, while preventing an increase in the size of the electrical device.

In order to achieve the above object, according to a first feature of the present invention, there is provided an electrical device cooling structure in a vehicle, comprising: an electrical device which includes: a battery for driving a motor for traveling; a DC/DC converter; and a motor driving inverter, the electrical device being disposed below a floor behind a seat, and cooled by cooling air, wherein the DC/DC converter and the motor driving inverter are arranged side by side in a vehicle width direction above the battery; and wherein the cooling air flows from a front side to a rear side of a vehicle body and separates into an upper portion and a lower portion which cool in parallel the DC/DC converter and the motor driving inverter on an upper side and the battery on a lower side, respectively.

With this structure, among the components of the electrical device which is disposed below the floor behind the seat in order to drive the motor for traveling, the battery is disposed in the lower position, and the DC/DC converter and the motor driving inverter are arranged side by side in the vehicle width direction above the battery. Therefore, the cooling air flowing from the front side to the rear side of the vehicle body is divided into upper and lower portions which cool in parallel the DC/DC converter and the motor driving inverter on the upper side and the battery on the lower side, respectively. With this arrangement, a passage of the cooling air is simplified to reduce the size of the entire electrical device, and improve mountability of the electrical device on the vehicle body. Further, the cooling air at low temperature before heat exchange is applied to all the battery, the DC/DC converter, and the motor driving inverter, thereby enhancing cooling effect and reducing pressure loss of the cooling air.

According to a second feature of the present invention, in addition to the first feature, a high voltage distribution board is arranged on one side of the battery in the vehicle width direction; an extending portion of the high voltage distribution board extends upward from an upper end of the battery; and the extending portion is connected to a smoothing capacitor provided in the DC/DC converter or the motor driving inverter.

With this structure, the extending portion, extending upward from the upper end of the battery, of the high voltage distribution board arranged on one side of the battery in the vehicle width direction is connected to the smoothing capacitor provided in the DC/DC converter or the motor driving inverter, thereby eliminating the need of or minimizing the length of a cable for connecting the high voltage distribution board, the smoothing capacitor, the DC/DC converter, and the motor driving inverter to each other.

According to a third feature of the present invention, in addition to the second feature, a contactor that interrupts an electrical current from the battery is disposed in the high voltage distribution board.

With this structure, the contactor that interrupts the electrical current from the battery is disposed in the high voltage distribution board, thereby eliminating the need of or minimizing the length of the cable for connecting the high voltage distribution board, the smoothing capacitor, the DC/DC converter, and the motor driving inverter to each other.

According to a fourth feature of the present invention, in addition to any of the first to third features, the DC/DC converter and the motor driving inverter are accommodated in a common metal case secured to the vehicle body; and the battery is supported on a lower surface of the metal case.

With this structure, the DC/DC converter and the motor driving inverter are accommodated in the common metal case secured to the vehicle body, and the battery is supported on the lower surface of the metal case. Therefore, electrical noise produced by the DC/DC converter and the motor driving inverter can be effectively insulated by the metal case. Also, the relatively heavy battery is disposed on the lower side and the relatively light DC/DC converter and motor driving inverter are disposed on the upper side, thereby improving the stability of the vehicle body.

According to a fifth feature of the present invention, in addition to the first feature, the cooling air portion having cooled the battery and the cooling air portion having cooled the DC/DC converter and the motor driving inverter are gathered to be discharged through a cooling fan arranged downstream of a position where the cooling air portions are gathered.

With this structure, the pressure loss of the cooling air can be reduced, and thus a small and inexpensive cooling fan can be used as the cooling fan disposed downstream of the position where the cooling air portions are gathered.

According to a sixth feature of the present invention, in addition to the fifth feature, the cooling fan is an axial fan.

With this structure, the cooling fan is a axial fan, thereby reducing the cost as compared with the case of using an expensive centrifugal fan having a complicated structure. Also, the battery and the electrical control devices are cooled in parallel to reduce the pressure loss of the cooling air, thereby ensuring sufficient cooling performance with the inexpensive axial fan.

According to a seventh feature of the present invention, in addition to the fifth or sixth feature, a cooling air discharge passage for discharging the cooling air having cooled the electrical device to the outside of the vehicle body is formed behind the cooling fan and along a lower surface of a floor member such that the cooling air discharge passage bifurcates to the right and left in the vehicle width direction.

With this structure, the cooling air discharge passage that discharges the cooling air having cooled the electrical device to the outside of the vehicle body is formed so as to bifurcate to the right and left in the vehicle width direction, along the lower surface of the floor member and behind the cooling fan. Therefore, it is possible to prevent the reduction of the space above the floor member by the cooling air discharge passage. Also, it is possible to secure a sufficient sectional area of the cooling air discharge passage downstream of the cooling fan to further reduce the pressure loss, thereby alleviating a load on the cooling fan.

A rear seat 16 of an embodiment corresponds to the seat of the present invention, a power supply unit 19 of the embodiment corresponds to the electrical device of the present invention, a rear floor 27 of the embodiment corresponds to the floor of the present invention, an upper resin case 32 of the embodiment corresponds to the floor member of the present invention, battery modules 37 of the embodiment correspond to the battery of the present invention, and a metal case lower part 45 and an metal case upper part 46 of the embodiment correspond to the metal case of the present invention.

The above-mentioned object, other objects, characteristics, and advantages of the present invention will become apparent from the preferred embodiment, which will be described in detail below by reference to the attached drawings.

BRIEF DESCRIPTION OF THE DRAWINGS

FIG. 9 is a diagram for explaining an operation of cooling the power supply unit.

DESCRIPTION OF THE PREFERRED EMBODIMENT

Figure 1:
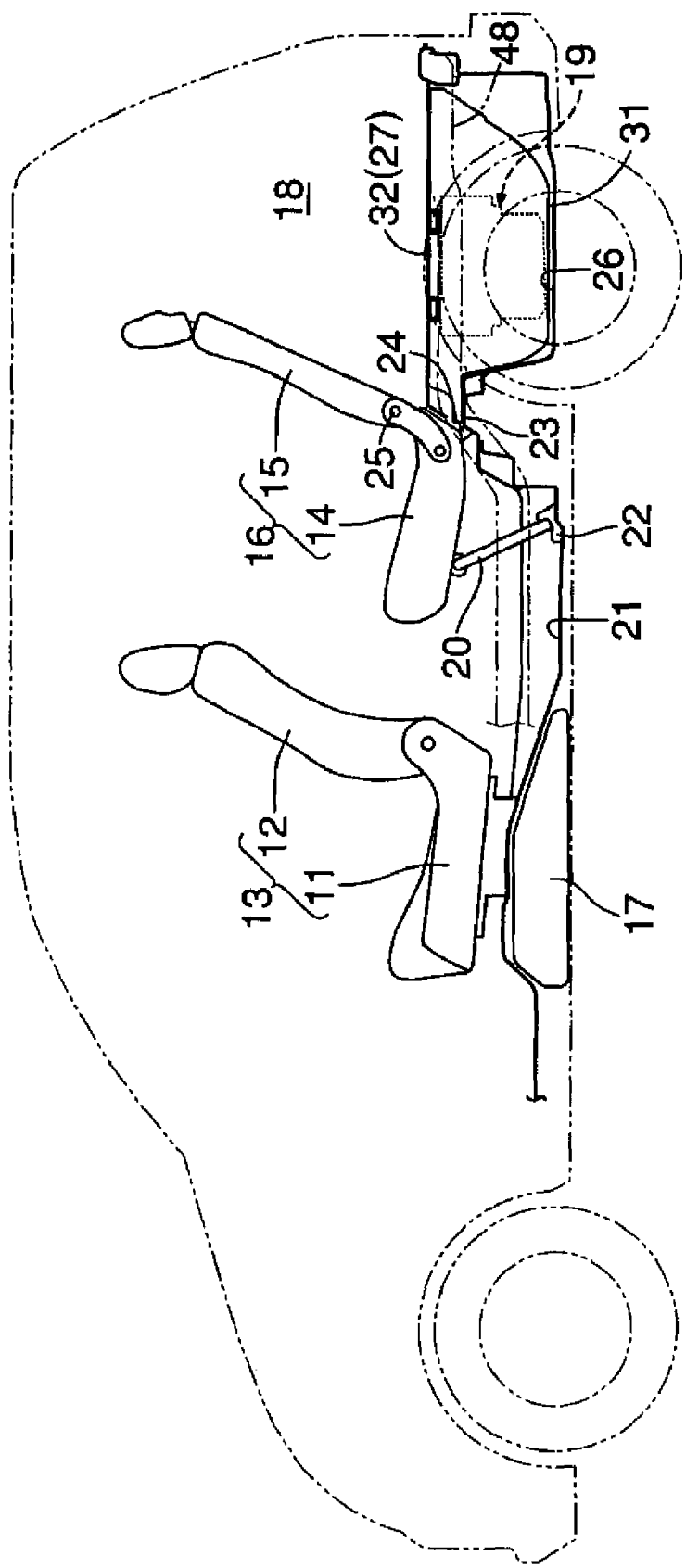
FIG. 1 is a side view of an entire hybrid vehicle which includes an electrical device cooling structure according to an embodiment of the present invention.
Figure 2:
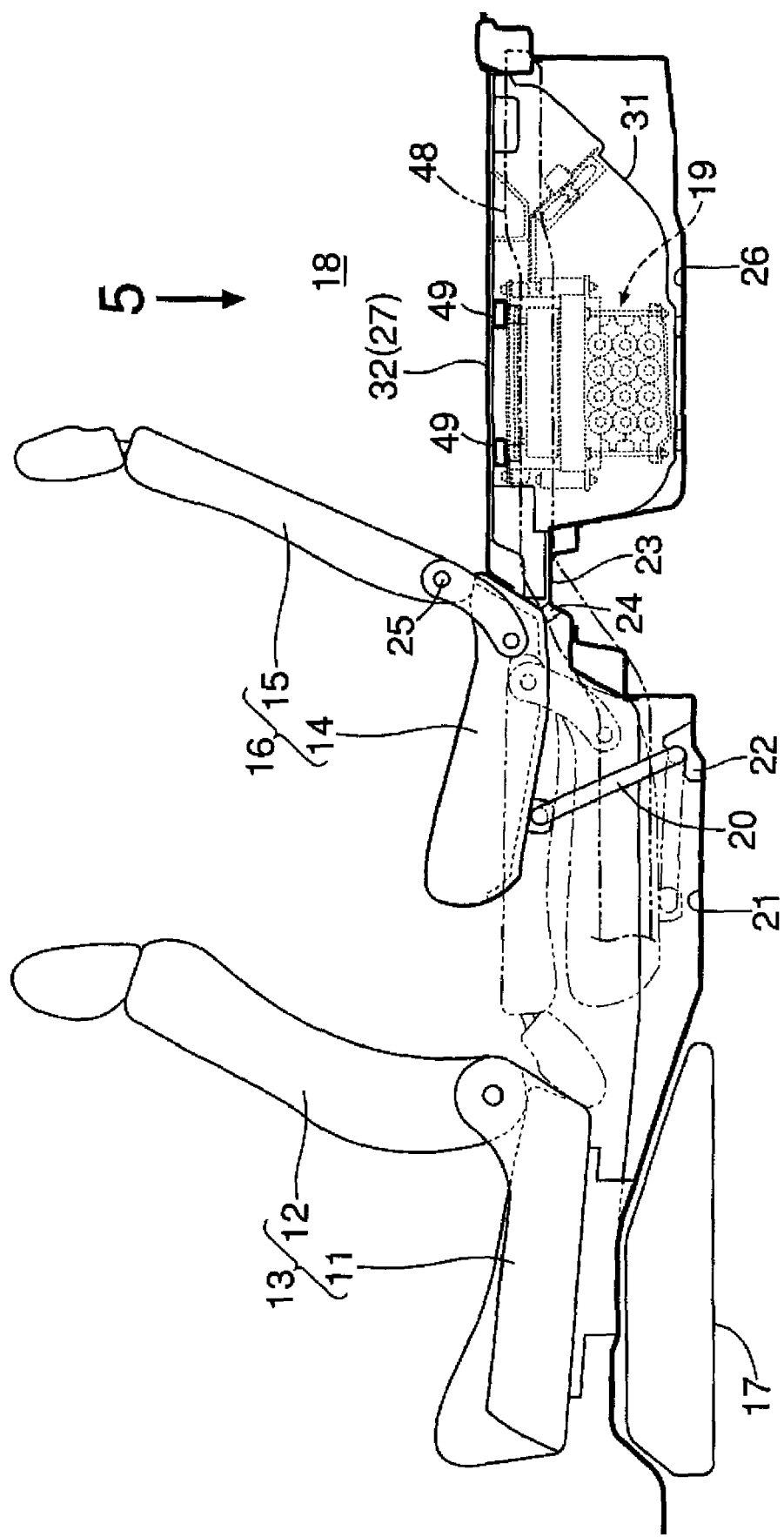
FIG. 2 is an enlarged view of essential portions of FIG. 1.
Figure 3:
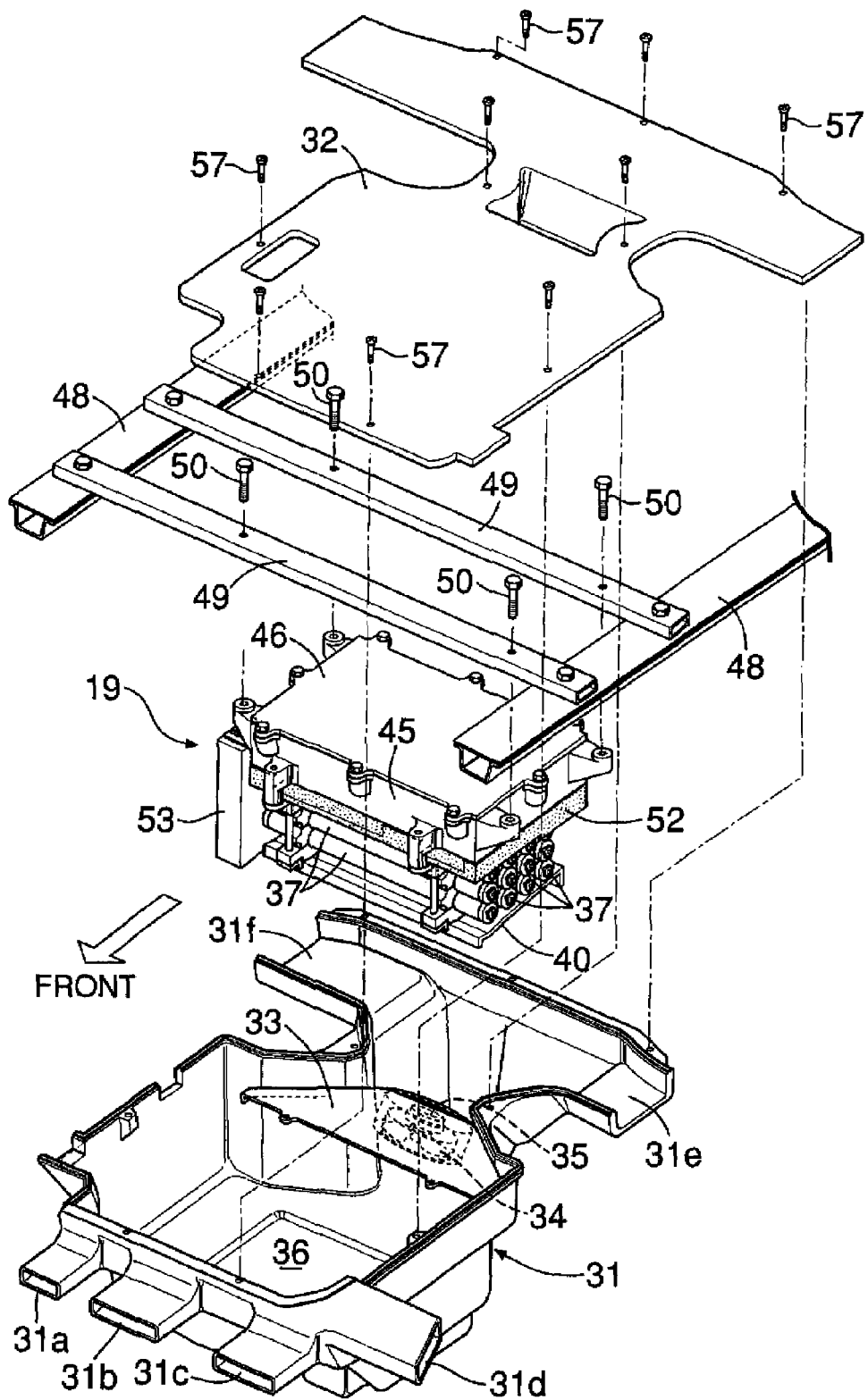
FIG. 3 is an exploded perspective view of a resin case and a power supply unit.
Figure 4:
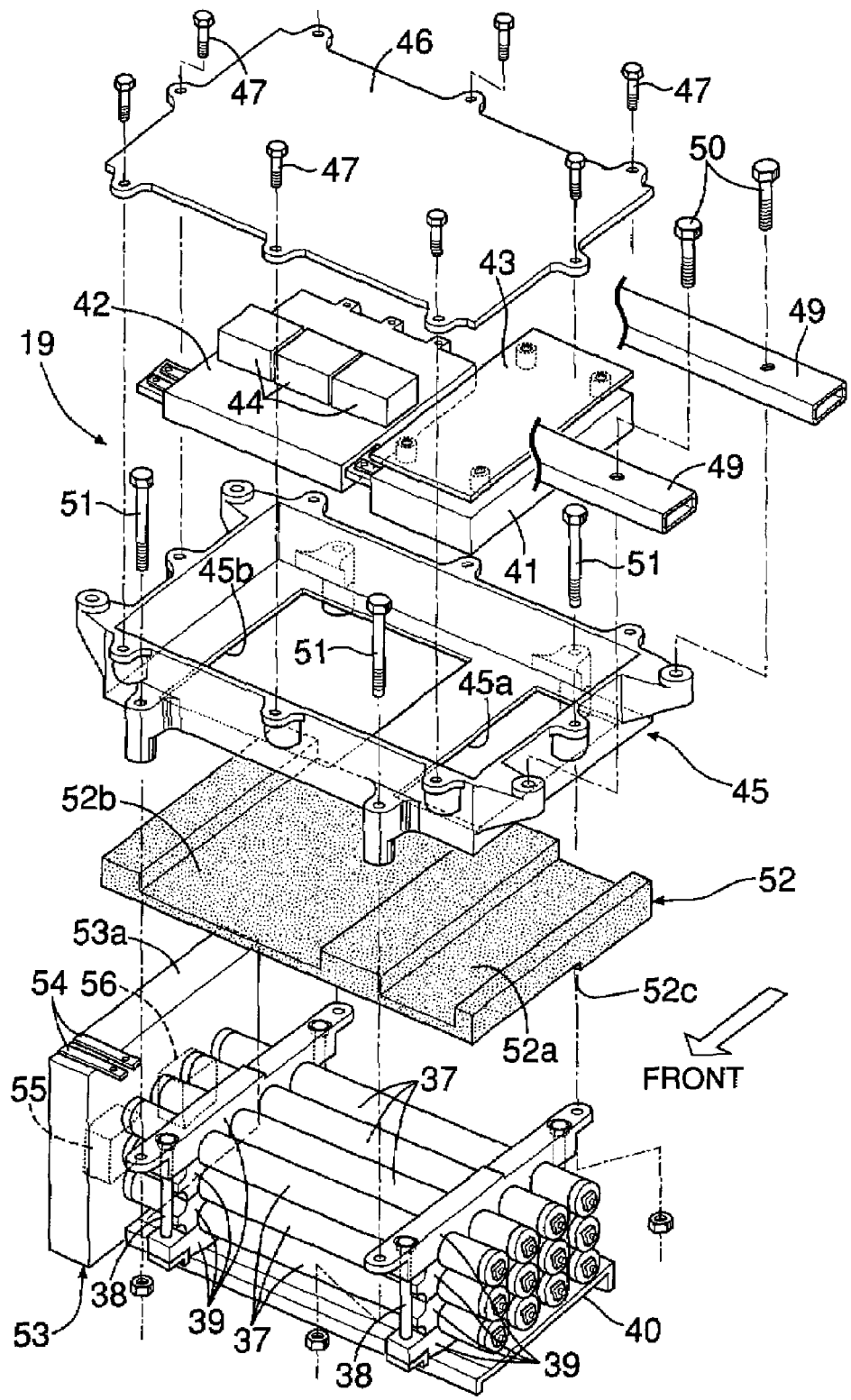
FIG. 4 is an exploded perspective view of the power supply unit.

As shown in FIGS. 1 and 2, a hybrid vehicle has an engine and a motor, which are not shown, as a drive source for traveling. The hybrid vehicle comprises: a front seat 13 including a seat cushion 11 and a seat back 12; and a rear seat 16 including a seat cushion 14 and a seat back 15. A fuel tank 17 is disposed below the seat cushion 11 of the front seat 13. A power supply unit 19 for driving the motor is mounted below a luggage space 18 behind the rear seat 16.

A pair of right and left stays 20 and 20 are foldably provided on a lower surface of the seat cushion 14 of the rear seat 16. In a use state of the rear seat 16, the rear seat 16 is fixed as follows: lower ends of the stays 20 and 20 are locked to hooks 22 and 22 provided on an under-seat floor 21 of the rear seat 16; and a rear end of the seat cushion 14 is locked to a seat cushion locking portion 24 provided on a bulging portion 23 in the rear of the under-seat floor 21. The seat back 15 can be tilted forward on a reclining shaft 25 provided at the rear end of the seat cushion 14.

Thus, if the rear end of the seat cushion 14 is separated from the seat cushion locking portion 24 on the bulging portion 23, the stays 20 and 20 swing forward around the hooks 22 and 22, and thus the seat cushion 14 moves forward while keeping its posture down to a position where the seat cushion 14 extends along the under-seat floor 21. Then, the seat back 15 is swung forward around the reclining shaft 25, whereby the rear seat 16 is folded such that the seat back 15 becomes substantially horizontal (see the chain lines in FIG. 2).

Figure 5:
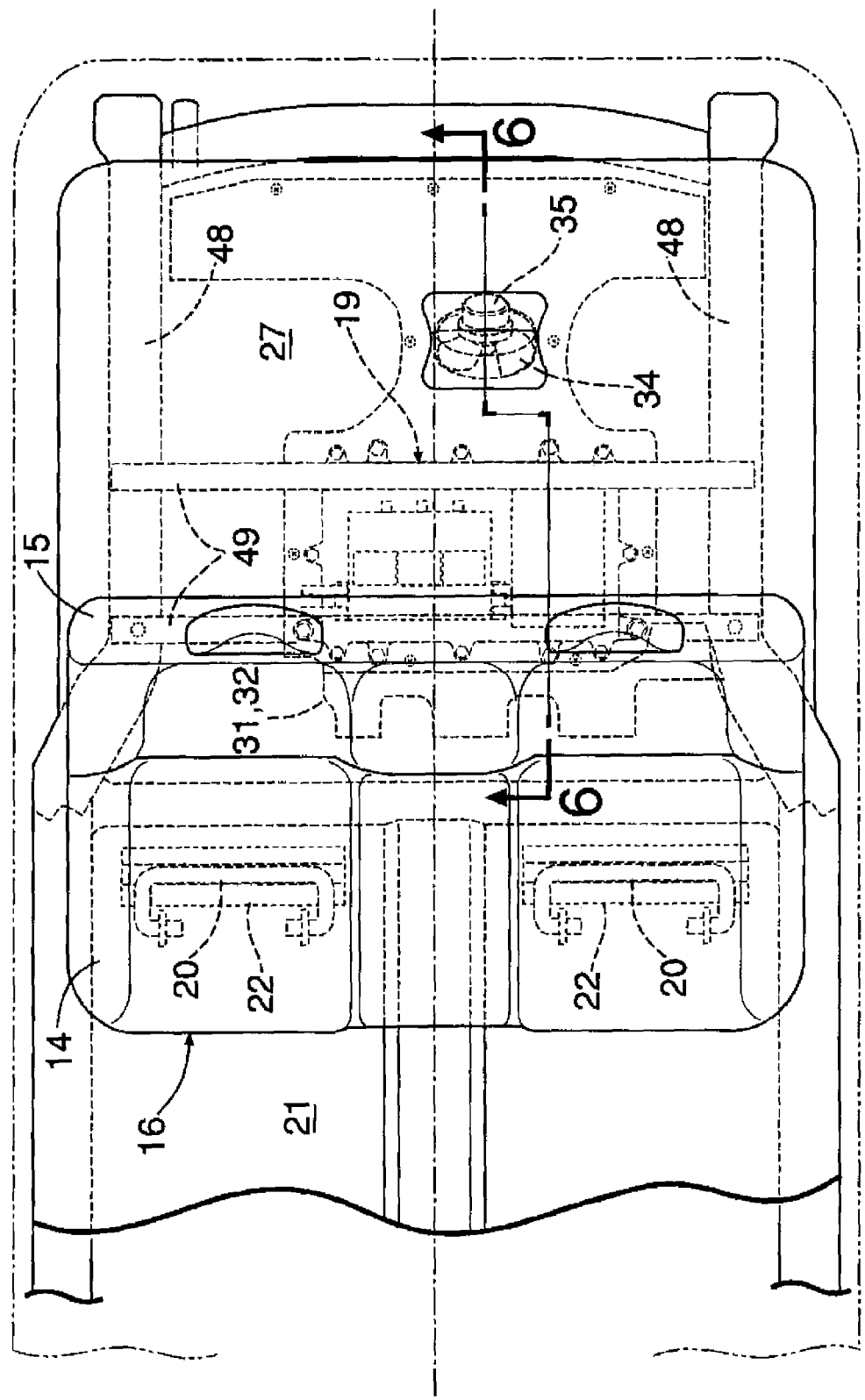
FIG. 5 is a view taken in the direction of arrow 5 in FIG. 2.

A power supply unit housing portion 26 recessed downward is provided in the rear of the bulging portion 23 behind the under-seat floor 21. A rear floor 27 (see FIG. 5) constituting a floor of the luggage space 18 covers a periphery of an upper opening of the power supply unit housing portion 26.

Next, the structure of the power supply unit 19 will be described with reference to FIGS. 3 to 8.

A casing for accommodating the power supply unit 19 includes a container-shaped lower resin case 31 and a substantially flat lid-shaped upper resin case 32. Integrally formed in the front portion of the lower resin case 31 are three duct-shaped cooling air suction passages 31$a$ to 31$c$ opening forward of the vehicle body, and a duct-like cooling air suction passage 31$d$ opening leftward of the vehicle body. Formed in the rear portion of the lower resin case 31 are two trough-shaped cooling air discharge passages 31$e$ and 31$f$ extending in the vehicle width direction.

Figure 6:
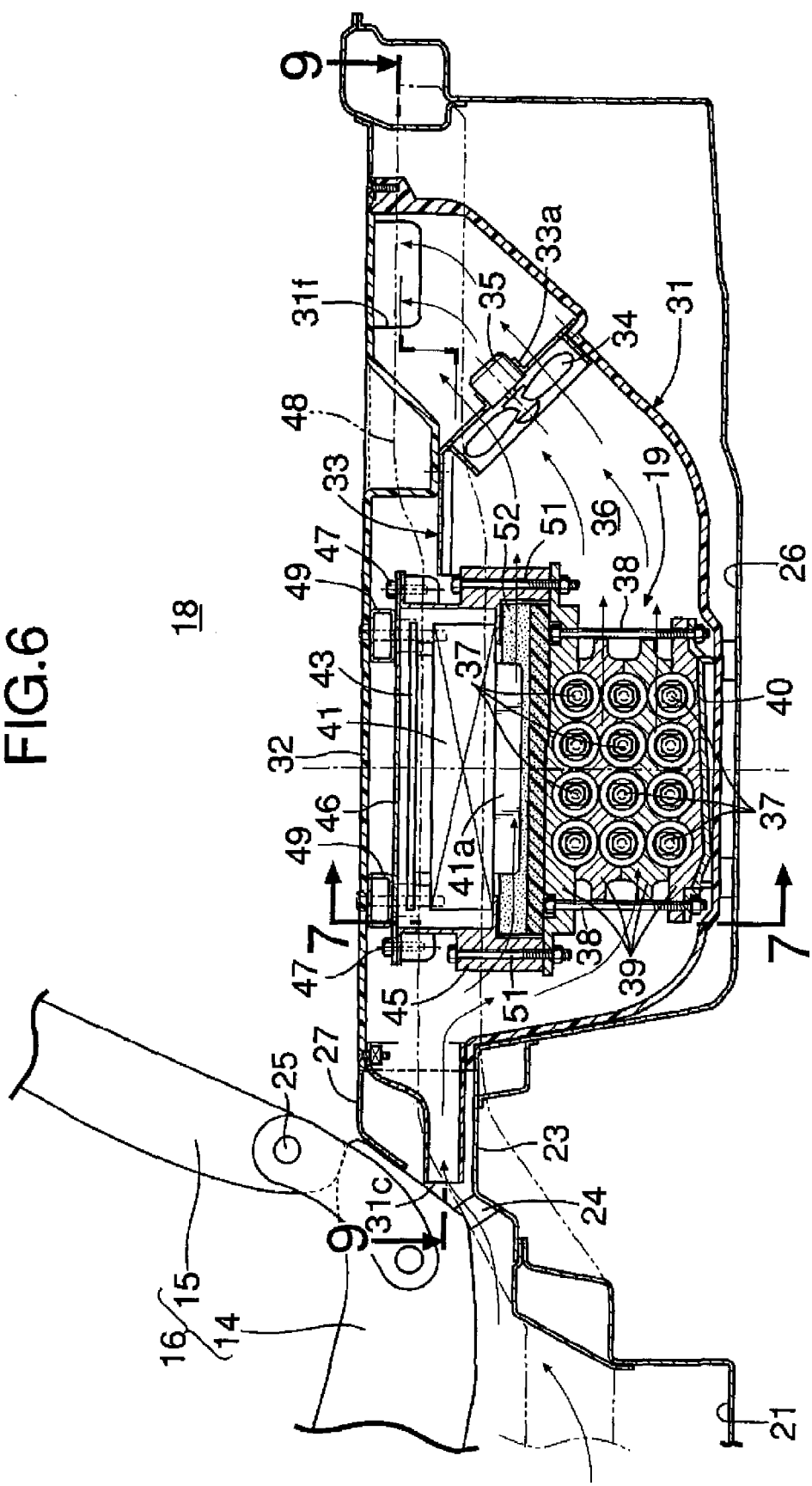
FIG. 6 is a sectional view taken along the line 6-6 in FIG. 5.

The cooling air suction passages 31$a$ to 31$c$ open at the rear end of the seat cushion 14 of the rear seat 16, and suck air in a vehicle compartment through a space on the lower surface of the seat cushion 14 (see FIG. 6). The cooling air suction passage 31$d$ opens at the lateral side of the seat cushion 14 of the rear seat 16, and sucks air in the vehicle compartment. The trough-shaped cooling air discharge passages 31$e$ and 31$f$ constitute a duct in cooperation with the upper resin case 32 connected to upper surfaces of these passages.

An air guide plate 33 is horizontally secured to an intermediate portion of the lower resin case 31. A motor support bracket 33$a$ is formed integrally with the rear portion of the air guide plate 33, and supports a cooling fan drive motor 35 that drives a cooling fan 34 which is an axial fan (see FIG. 6). The lower case 31 is narrowed at a position of the cooling fan 34. A large-capacity power supply unit accommodating chamber 36 is formed on the front side of the cooling fan 34. The cooling air discharge passages 31e and 31f are formed in the rear side of the cooling fan 34. Thus, cooling air guided rearward through the cooling fan 34 diverges into the left and right cooling air discharge passages 31e and 31f.

The power supply unit 19 includes total twelve cylindrical battery modules 37 arranged in four rows and three layers. The battery modules 37 are held and bundled between two sets of left and right battery holders 39, each set including vertically divided four portions which are fastened together by two bolts 38 and 38. In this structure, the air guide plate 40 is disposed on a lower surface of the lowermost battery holder 39, and also fastened thereto together by the bolts 38 (see FIG. 8). An upper surface of the air guide plate 40 facing the lowermost battery modules 37 is inclined so that the rear side becomes higher, that is, the rear side is close to the lowermost battery modules 37.

Further, the power supply unit 19 includes: a DC/DC converter 41 that reduces a high voltage of the battery modules 37 electrically connected in series down to 12 volts; a motor driving inverter (PDU) 42 that converts a DC electrical current of the battery modules 37 into an AC electrical current and controls driving of the motor; an electronic control unit 43 provided on a printed circuit board; and smoothing capacitors 44 for the motor driving inverter 42. The DC/DC converter 41, the motor driving inverter 42, the electronic control unit 43, and the smoothing capacitors 44 are accommodated in a space defined by a container-shaped metal case lower part 45 having an open upper surface, and a flat lid-shaped metal case upper part 46 connected to the upper surface of the metal case lower part 45 by a plurality of bolts 47. Thus, such high voltage components that produce electrical noise are accommodated in the space surrounded by the metal case lower part 45 and the metal case upper part 46, thereby eliminating the influence of the electrical noise on other devices.

The DC/DC converter 41 and the motor driving inverter 42 are arranged side by side on the left and right sides, respectively, in the vehicle width direction. The electronic control unit 43 is disposed above the DC/DC converter 41. Three smoothing capacitors 44 are disposed on an upper surface of the motor driving inverter 42.

The metal case lower part 45 is secured by a plurality of bolts 50 to lower surfaces of two power supply unit support frames 49 and 49 extending between left and right side frames 48 and 48 in the vehicle width direction. The two sets of right and left battery holders 39 that bundle the battery modules 37 are suspended from the lower surface of the metal case lower part 45 through a plurality of bolts 51. In this structure, a styrofoam insulator 52 is held between the lower surface of the metal case lower part 45 and the upper surfaces of the uppermost battery modules 37.

As described above, in the power supply unit 19, the relatively heavy battery modules 37 are disposed on the lower side, and the DC/DC converter 41 and the motor driving inverter 42 lighter than the battery modules 37 are disposed above the battery modules 37, thereby lowering the center of gravity of the power supply unit 19 to improve stability of the vehicle.

The metal case lower part 45 has an opening 45a facing a lower surface of the DC/DC converter 41, and an opening 45b facing a lower surface of the motor driving inverter 42. Two air guide grooves 52a and 52b extending in the forward/rearward direction are formed on an upper surface of the insulator 52 facing the openings 45a and 45b (see FIG. 7). A plurality of cooling fins 41a projectingly provided on the lower surface of the DC/DC converter 41, pass through the opening 45a of the metal case lower part 45, and protrude into the air guide groove 52a of the insulator 52. A plurality of cooling fins 42a projectingly provided on the lower surface of the motor driving inverter 42, pass through the opening 45b of the metal case lower part 45, and protrude into the air guide groove 52b of the insulator 52.

Figure 8:
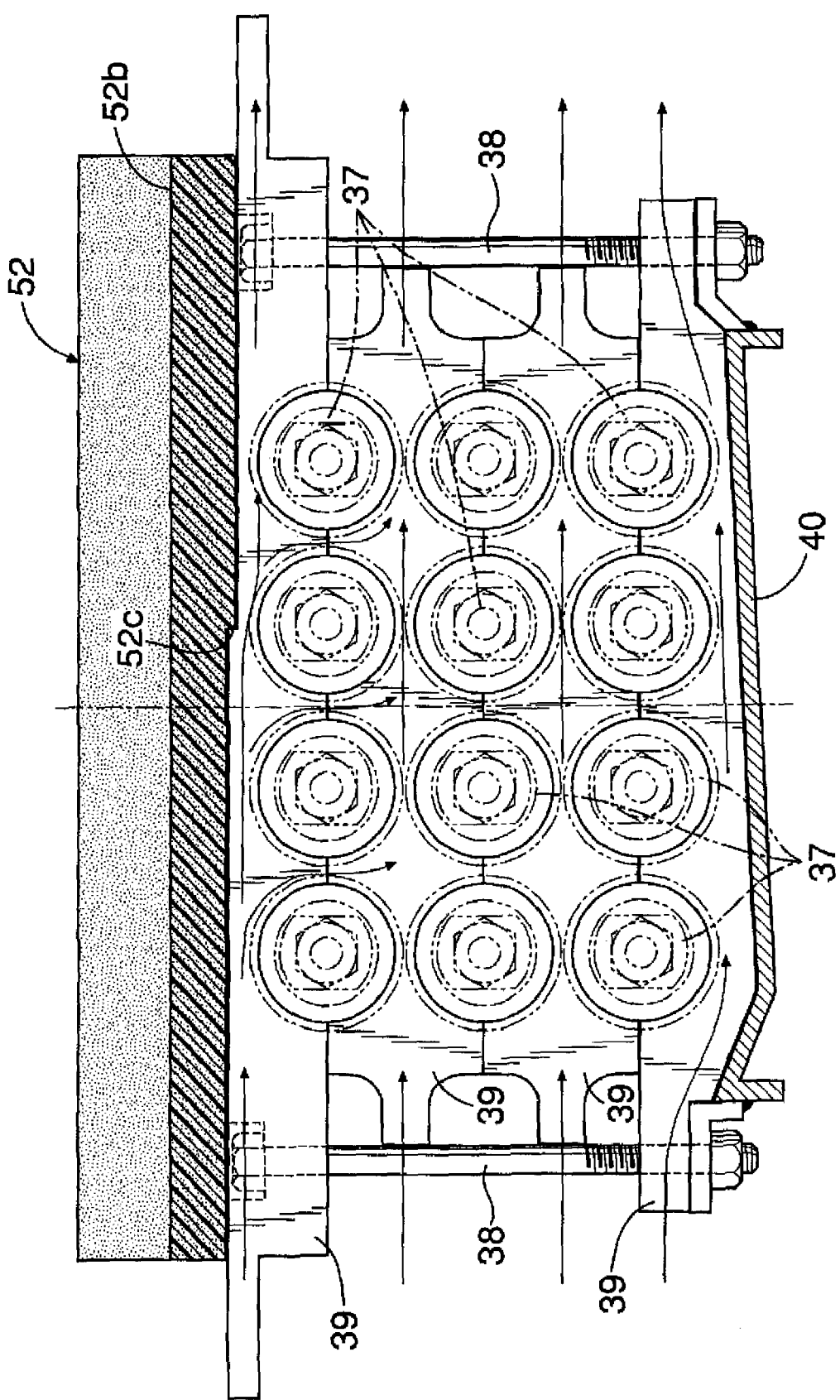
FIG. 8 is a sectional view taken along the line 8-8 in FIG. 7.

A step portion 52c extending in the vehicle width direction is formed on the lower surface of the insulator 52 facing the upper surfaces of the uppermost battery modules 37 (see FIG. 8). A space between the upper surfaces of the battery modules 37 and the lower surface of the insulator 52 is wide on the front side of the step portion 52c, and narrow on the rear side thereof.

A rectangular plate-shaped high voltage distribution board 53 is disposed on the right side of the battery modules 37 stacked in three layers. An upper portion of the high voltage distribution board 53 comprises an extending portion 53a extending upward beyond the upper surfaces of the uppermost battery modules 37. A left side surface of the extending portion 53a extends to a position facing close to the right side surface of the motor driving inverter 42. The extending portion 53a of the high voltage distribution board 53 and the smoothing capacitors 44 are connected to each other by a pair of terminals 54 and 54. Provided on the right side surface of the high voltage distribution board 53 are a contactor 55 that turns on/off an electrical current from the battery modules 37, and an electrical current sensor 56 that detects an electrical current that flows in or out of the battery modules 37.

The thus-structured power supply unit 19 is accommodated in the lower resin case 31, and the upper resin case 32 is secured by the plurality of bolts 57 to the lower resin case 31 so as to cover the upper surface opening of the lower resin case 31. In this state, the upper resin case 32 becomes flush with the rear floor 27, such that the upper resin case 32 and the rear floor 27 cooperate to constitute the floor surface of the luggage space 18.

Next, the operation of the embodiment of the present invention having the above-described structure will be described.

When the motor for traveling is driven by the electrical current supplied from the power supply unit 19, the battery modules 37, the DC/DC converter 41, the motor driving inverter 42 or the like in the power supply unit 19 generate heat. Thus, they are required to be cooled with cooling air generated by driving the cooling fan 34 with the fan drive motor 35.

As shown in FIG. 6, when the cooling fan 34 is rotated, a negative pressure is generated in the power supply unit accommodating chamber 36 defined by the lower resin case 31 and the upper resin case 32. Air in the vehicle compartment is sucked into the power supply unit accommodating chamber 36 through the four cooling air suction passages 31a to 31d. The cooling air is divided into upper and lower portions at the position of the insulator 52 in the power supply unit accommodating chamber 36, and the cooling air lower portion passing on the lower side flows rearward through gaps between the total twelve battery modules 37 arranged in four rows and three layers, and cools the battery modules 37 while passing therethrough.

In this arrangement, as shown in FIG. 8, the air guide plate 40 facing the lower surfaces of the lowermost battery modules 37 is inclined upward to the rear side, and the step portion 52c is formed on the lower surface of the insulator 52 facing the upper surfaces of the uppermost battery modules 37. That is, the sectional area of the passage on the downstream side of the power supply unit accommodating chamber 36 is narrowed to increase flow velocity of the cooling air. Therefore, it is possible to efficiently cool the battery modules 37 on the downstream side that are difficult to cool, thereby uniformly cooling all the battery modules 37.

Figure 7:
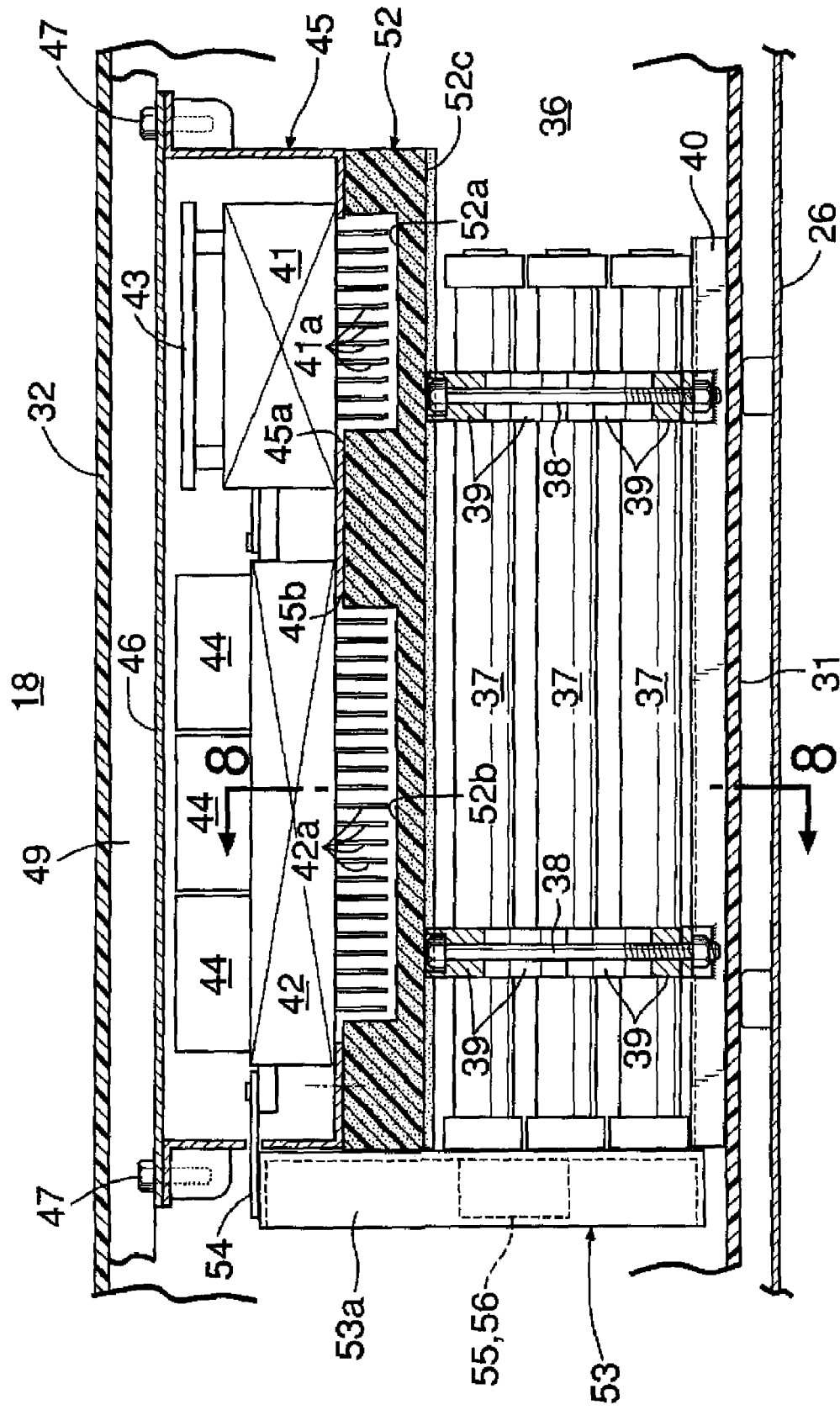
FIG. 7 is a sectional view taken along the line 7-7 in FIG. 6.

As shown in FIGS. 6, 7 and 9, the upper cooling air portion flowing to the upper side of the insulator 52 is divided into the left and right air guide grooves 52a and 52b formed in the forward/rearward direction on the upper surface of the insulator 52. The divided cooling air portions pass from the front side to the rear side, one of the portions comes into contact with the cooling fins 41a of the DC/DC converter 41 protruding downward from the opening 45a of the metal case lower part 45 to cool the DC/DC converter 41, and the other comes into contact with the cooling fins 42a of the motor driving inverter 42 protruding downward from the opening 45b of the metal case lower part 45 to cool the motor driving inverter 42.

Thus, the cooling air portions having cooled the power supply unit 19 are gathered and caused to pass through the cooling fan 34, and the cooling air is then divided into the left and right cooling air discharge passages 31e and 31f behind the cooling fan 34. The lower ends of the left and right cooling air discharge passages 31e and 31f divided into the left and right sides in the vehicle width direction enter a space between a lining of the luggage space 18 and a rear fender. Thus, one portion of the cooling air is discharged to the outside of the vehicle, and the other portion thereof is returned to the vehicle compartment. In this arrangement, silencers may be provided in the cooling air discharge passages 31e and 31f so as to prevent exhaust noise from being transmitted to the vehicle compartment.

The power supply unit housing portion 26 formed in the rear floor 27 is generally used as a portion for accommodating a spare tire. This space is also used to accommodate the power supply unit 19, thereby preventing the luggage space 18 behind the rear seat 16 from being limited. Also, the upper resin case 32 covering the upper surface opening of the lower resin case 31 that houses the power supply unit 19 is connected to the rear floor 27 on the same plane to constitute the flat floor surface of the luggage space 18, thereby improving usability of the luggage space 18.

The DC/DC converter 41 and the motor driving inverter 42 are disposed on the left side and right side, respectively, above the bundled twelve battery modules 37. The electronic control unit 43 is supported by the upper portion of the DC/DC converter 41. The smoothing capacitors 44 are supported by the upper portion of the motor driving inverter 42. The high voltage distribution board 53 is disposed on the side of these devices. Therefore, it is possible to downsize the power supply unit 19 so as to be easily accommodated in the power supply unit housing portion 26 formed in the rear floor 27. Also, it is possible to eliminate the need of or minimize the length of a cable connecting these devices to each other. For example, the contactor 55 is provided in the high voltage distribution board 53 to eliminate a cable connecting the battery modules 37 and the motor driving inverter 42 to each other, or the extending portion 53a is formed in the high voltage distribution board 53 to connect the extending portion 53a and the smoothing capacitors 44 to each other through the terminals 54 and 54 without using a cable.

The cooling air sucked into the power supply unit accommodating chamber 36 in the lower resin case 31 is divided into the upper and lower portions to cool in parallel the DC/DC converter 41 and the motor driving inverter 42 on the upper side and the battery modules 37 on the lower side. Therefore, it is possible to bring the cooling air at low temperature before heat exchange into contact with the battery modules 37, the DC/DC converter 41, and the motor driving inverter 42 to uniformly cool these devices, thereby minimizing the pressure loss of the cooling air. Thus, a sufficient cooling performance can be obtained using only an inexpensive axial fan as the cooling fan 34 without using an expensive centrifugal fan (for example, a sirocco fan).

Supposing that the battery modules 37, the DC/DC converter 41, and the motor driving inverter 42 are cooled in series, there is a problem that the cooling effect for the devices disposed on the upstream side is increased, while the cooling effect for the devices disposed on the downstream side is decreased. Also, because the pressure loss of the cooling air is increased, it is required to provide a cooling fan 34 and a cooling fan drive motor 35 having a high performance, thereby disadvantageously increasing the cost.

The cooling air discharge passages 31e and 31f for passing therethrough the cooling air having passed through the cooling fan 34 are bifurcated, thereby securing a sufficient total sectional area of the cooling air discharge passages 31e and 31f, and reducing back pressure of the cooling fan 34 to further reduce the load on the cooling fan drive motor 35. In addition, the cooling air discharge passages 31e and 31f are formed on the lower surface of the upper resin case 32, that is, the lower surface of the rear floor 27, thereby preventing the capacity of the luggage space 18 from being limited.

The embodiment of the present invention has been described above, but various changes in design may be made to the present invention without departing from the subject matter of the invention.

For example, in the embodiment, the hybrid vehicle including the engine and the motor is described as the drive source for traveling, but the present invention is also applicable to an electric vehicle including only a motor as a drive source for traveling.

What is claimed is:

1. An electrical device cooling structure in a vehicle, comprising:
an electrical device which includes:
a battery for driving a motor for traveling;
a DC/DC converter; and
a motor driving inverter,
the electrical device being disposed below a floor behind a seat, and cooled by cooling air,
wherein the DC/DC converter and the motor driving inverter are arranged side by side in a vehicle width direction above the battery; and
wherein the cooling air flows from a front side to a rear side of a vehicle body and separates into an upper portion and a lower portion which cool in parallel the DC/DC converter and the motor driving inverter on an upper side and the battery on a lower side, respectively.

2. The electrical device cooling structure in a vehicle according to claim 1, wherein a high voltage distribution board is arranged on one side of the battery in the vehicle width direction; an extending portion of the high voltage distribution board extends upward from an upper end of the battery; and the extending portion is connected to a smoothing capacitor provided in the DC/DC converter or the motor driving inverter.

3. The electrical device cooling structure in a vehicle according to claim 2, wherein a contactor that interrupts an electrical current from the battery is disposed on the high voltage distribution board.

4. The electrical device cooling structure in a vehicle according to any of claims 1 to 3, wherein the DC/DC converter and the motor driving inverter are accommodated in a common metal case secured to the vehicle body; and the battery is supported on a lower surface of the metal case.

5. The electrical device cooling structure in a vehicle according to claim 1, wherein the cooling air portion having cooled the battery and the cooling air portion having cooled the DC/DC converter and the motor driving inverter are gathered to be discharged through a cooling fan arranged downstream of a position where the cooling air portions are gathered.

6. The electrical device cooling structure in a vehicle according to claim 5, wherein the cooling fan is an axial fan.

7. The electrical device cooling structure in a vehicle according to claim 5 or 6, wherein a cooling air discharge passage for discharging the cooling air having cooled the electrical device to the outside of the vehicle body is formed behind the cooling fan and along a lower surface of a floor member such that the cooling air discharge passage bifurcates to the right and left in the vehicle width direction.

* * * * *